June 22, 1965 C. E. LYON, JR 3,190,132
TUNER MECHANISM
Filed Oct. 15, 1962 2 Sheets-Sheet 1
FIG. 1
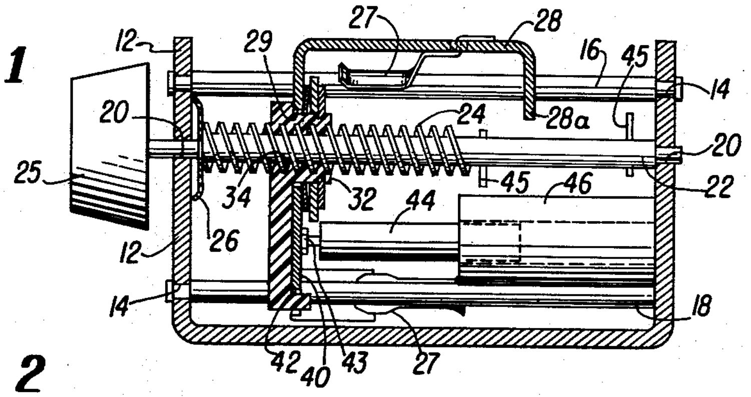
FIG. 2
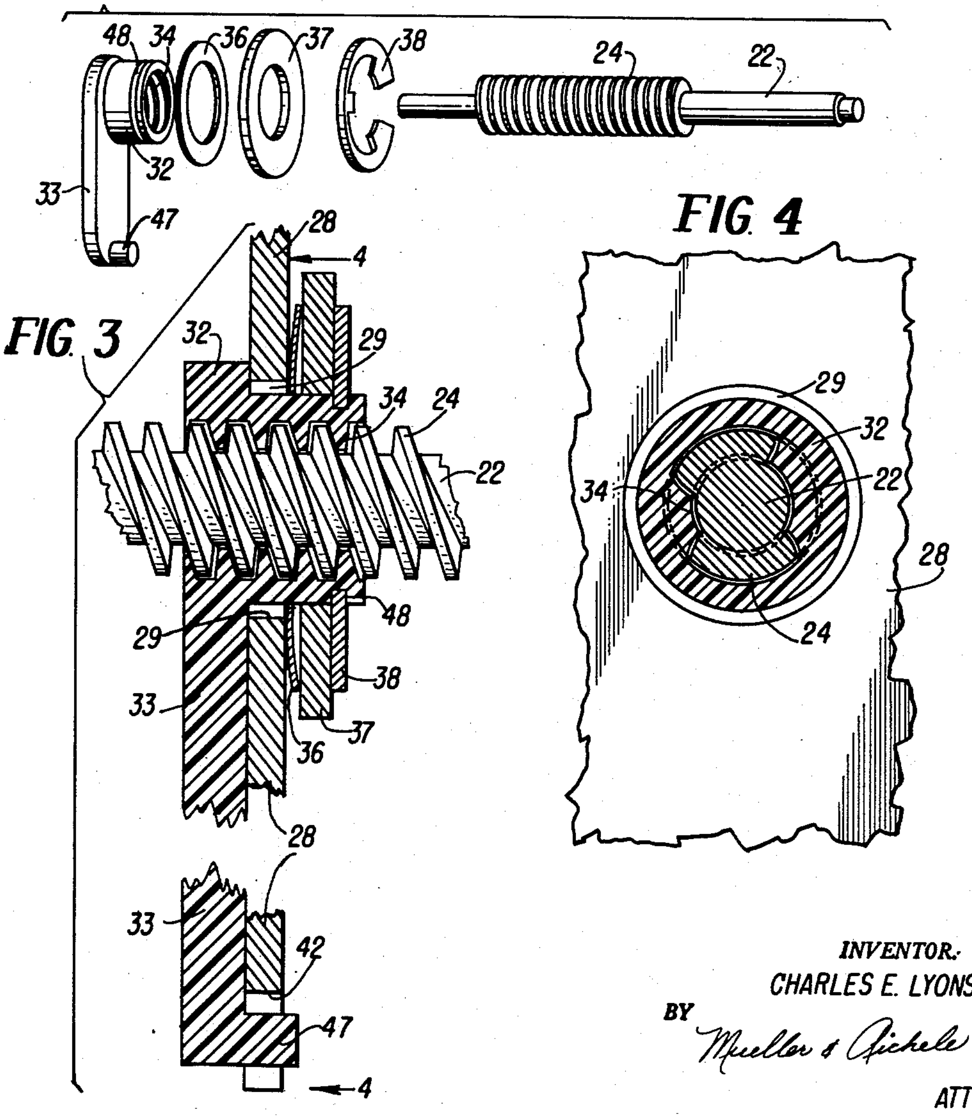 FIG. 3, FIG. 4
INVENTOR.
CHARLES E. LYONS JR.
BY Mueller & Aichele
ATTYS.

June 22, 1965 — C. E. LYON, JR — 3,190,132

TUNER MECHANISM

Filed Oct. 15, 1962 — 2 Sheets-Sheet 2

INVENTOR
CHARLES E. LYON JR.

BY Mueller & Aichele

ATTYS.

United States Patent Office 3,190,132

Patented June 22, 1965

3,190,132
TUNER MECHANISM

Charles E. Lyon, Jr., Des Plaines, Ill., assignor to Motorola, Inc., Chicago, Ill., a corporation of Illinois Filed Oct. 15, 1962, Ser. No. 231,060
11 Claims. (Cl. 74—10.85)

This invention relates to radio receiver tuner drive mechanisms and more particularly to a mechanism for providing longitudinal movement of tuning elements from a rotary tuning control. The present application is a continuation-in-part of application Serial No. 109,026, filed May 10, 1961, now abandoned.

Present day tuning devices employ a movable carriage adapted to position the cores of a plurality of inductors in response to adjustment in the position of the carriage. It is therefore important that the movable core carriage be accurately positionable in order that tuning be clear and well defined. In order to achieve this, the operative connection between the manual tuning control and the core carriage should be as accurate as possible. In many radio transmitters and receivers, particularly those which are mounted in moving objects, such as automobiles and the like, considerable vibration and jarring takes place. This causes play between the tuning control and the various tuning elements.

With the trend to miniaturization in radio receivers, prompted by the increased availability of semiconductors, it has become highly desirable to reduce, as much as possible, the size of the mechanical portions of the receiver. Tuning mechanisms which eliminate backlash are often complex and employ bulky mechanical parts which increase the size of the radio receiver.

In addition, worm shafts employed in present day tuning control mechanisms frequently are formed with various imperfections which, if not compensated for, cause backlash and consequent faulty operation of the tuner. The worm shaft of a tuner drive mechanism may be bent and any revolution thereof would cause a binding action with the core carriage which prevents smooth operation of the tuner mechanism.

It is therefore an object of the present invention to provide an improved tuner drive mechanism.

A further object of the present invention is to provide new and improved means of preventing backlash in a tuner drive mechanism.

Still another object of the invention is to provide a tuner drive mechanism of the type wherein a worm gear shaft drives a core carriage assembly in which binding action does not take place if the worm gear shaft is slightly bent.

A still further object of the invention is to provide a backlash free tuner drive mechanism of simple construction for use in a miniature tuner device.

A feature of the present invention is the provision of a radio receiver tuner drive mechanism including a floating sleeve made of plastic or other resilient material and adapted to be rotatably positioned upon a worm drive shaft, with the sleeve having internal threads formed to provide an interference fit with the threads on the worm shaft.

Another feature of the present invention is the provision of a tuner drive mechanism having a sleeve mounted on a core carriage by a C-washer and spring wave washer to maintain the two in the desired relationship.

Still another feature of the invention is the provision of a core carriage assembly sleeve which cooperates with a worm drive shaft having a flanged end portion disposed within an opening in the core carriage, with the sleeve being movable with respect to the carriage transversely of the drive shaft but held against pivotal motion about the axis of the worm shaft during rotation thereof.

Another feature of the invention is the provision of a core carriage assembly for a tuner having a member fixed thereto with an internally threaded portion cooperating with a worm drive shaft, wherein the threads on the member and the shaft have different leads providing an interference fit between the member and the worm shaft.

Another feature is the provision of a guiding ridge for the core carriage which mates with a slot on the carriage and is held therein by ribs on the ridge.

FIG. 1 is a sectional view of a tuning mechanism core carriage assembly constructed in accordance with the present invention;

FIG. 2 is an exploded view of the worm and sleeve shaft assembly of the present invention;

FIG. 3 is an enlarged sectional view partly fragmentary of a worm and sleeve shaft assembly;

FIG. 4 is an enlarged sectional view taken on line 4—4 of FIG. 3;

Figure 6:
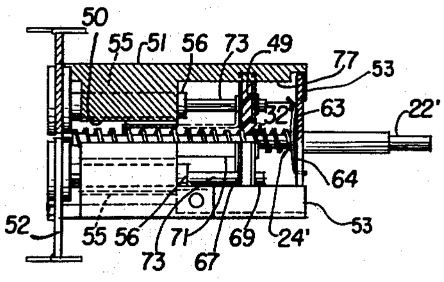
Figure 5:
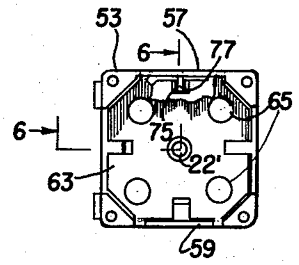
FIG. 5 is an end view of a further embodiment of the tuning mechanism core carriage assembly of the invention with parts broken away.
Figure 7A:
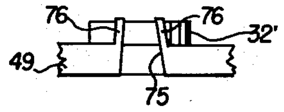
Figure 5A:
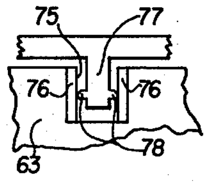
Figure 7:
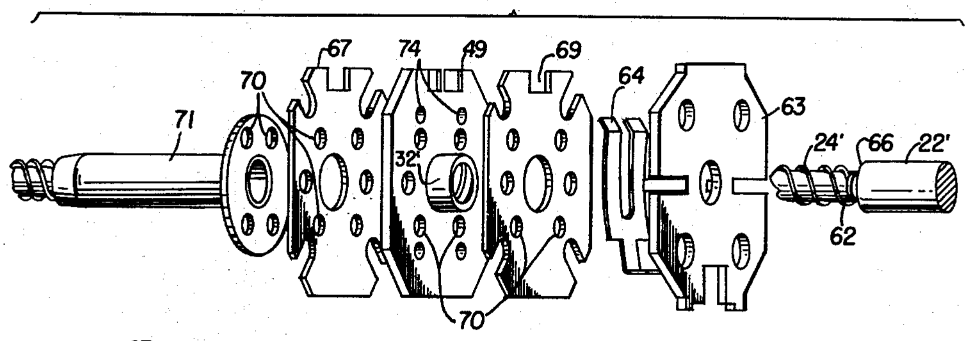

FIG. *5a* is an enlarged view of a portion of the assembly of FIG. 5;

FIG. 6 is a sectional view, taken along the lines 6—6 of FIG. 5;

FIG. 7 is an exploded view of the worm shaft and core carriage assembly of the embodiments of FIGS. 5 and 6;

FIG. *7a* is a top view of a portion of a part shown in FIG. 7 and

Figure 8:
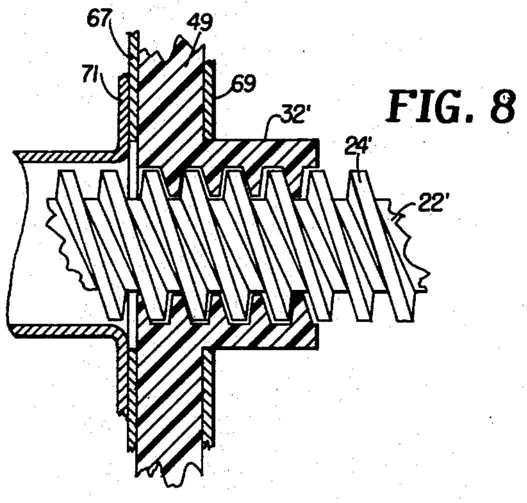

FIG. 8 is an enlarged sectional view of a portion of the core carriage assembly of FIG. 6.

In the present invention the core carriage of a control drive mechanism for a radio receiver tuner device is supported for movement along guide rods which are held in a frame. A floating sleeve formed of plastic or other resilient material is attached to the carriage and is threadably disposed upon a worm drive shaft rotatably mounted on the frame. The lead of the internal threads of this plastic sleeve differs from the threads of the worm shaft so that there is an interference between the threads which prevent backlash between the worm shaft and the plastic sleeve. The threads of the resilient sleeve provide resilient pressure against the threads on the shaft. The sleeve is mounted on the carriage by a flange which engages the carriage, and a C-washer which fits into a groove in the sleeve and cooperates with a spring washer to hold the sleeve under tension. The sleeve is movable with respect to the carriage transversely of the drive shaft so that it can follow a slight bend in the shaft without causing a binding action. Rotation of the sleeve about the axis of the worm shaft is restricted by means of an arm formed on the sleeve which fits into an opening in the core carriage member.

In a second embodiment of the invention, the core carriage assembly is slidably mounted in the frame between four corner posts and is guided by a slot mating with a raised ridge along a web joining two of the corner posts. Two ribs extend along either side of the ridge and form a cross section slightly greater in width than the slot to insure a tight resilient fit. In this embodiment of the invention the sleeve may be fixed directly to the core carriage.

Referring now particularly to FIG. 1, the tuner assembly of the present invention comprises a U-shaped frame 12 formed with a plurality of openings 14 therethrough. The openings 14 are formed within the frame 12 to fixedly receive two guide rods 16 and 18. Further openings 20 are formed in the frame portion to rotatably receive a worm gear shaft 22 having spiral gear teeth or threads 24 formed thereon and knob 25 fixed to the end portion thereof. A torque creating spring 26 is mounted over the worm shaft 22 adjacent the wall of the frame 12.

A core carriage 28 is slidably mounted upon the guide rods 16 and 18 and has an opening 29 formed therethrough to receive an internally threaded plastic sleeve 32. The opening 29 is larger than the external diameter of the sleeve 32 (FIG. 4). The internal threads 34 of the sleeve 32 cooperate with the external threads 24 upon the worm shaft 22 to move the core carriage 28 along the rods 16 and 18 when the worm shaft 22 is rotated. Sliding braces 27 fixed to the L-shaped core carriage 28 engage rods 16 and 18 to steady the operation of core carriage 28. The bottom end portion or leg 40 of the core carriage 28 is slidably mounted upon the guide rod 18.

The sleeve 32 is secured in position on the carriage by an annular flange 33 formed on the sleeve 32 and engaging the carriage 28 on one side. A C-washer 38 which is fastened in a groove 48 in the sleeve 32 holds flat washer 37 and spring washer 36 in position against the other side of the carriage 28. It will be seen that the sleeve 32 moves the core carriage 28 horizontally upon the guide rods 16 and 18 when the worm shaft 22 is rotated.

The core carriage 28 is formed with a plurality of openings 43 to receive the end portions of the cores 44, which are telescopically received in coils 46 supported on the frame 12. Stop rods 45 are mounted on the worm shaft 22 to limit rotation thereof by abutting upon arm portion **28*a* of core carriage 28**.

It will be noted (FIG. 3) that threads 34 upon the sleeve 32 are of a different lead than the threads 24 of the worm shaft 22, and therefore an interference fit is afforded which eliminates backlash between the core carriage 28 and the worm shaft 22. The sleeve is formed of a resilient material which adjusts for the different thread leads and applies resilient pressure to prevent backlash.

The core carriage 28 is further formed with an elongated opening 42 to receive a projection 47 extending radially from the flange 33 to restrict pivotal movement of the sleeve 32 about the axis of the worm shaft 22 to a predetermined arc. Due to the fact that the opening 29 is larger than the external diameter of the sleeve 32, and due to the elongated configuration of the opening 42 for the projection 47, the sleeve in effect floats in the opening 29, with the projection 47 riding up and down within the confines of the opening 42. The sleeve 32 is held against the core carriage 28 by action of spring washer 36, flat washer 37, and C-washer 38 which is held in annular groove 48 in the sleeve 32.

Referring now to FIGS. 6 through 9, another embodiment of the invention is shown which is especially adapted to miniaturization. A frame member or core block 51 is molded of non-magnetic material such as a zinc-lead alloy to have four corner posts 53 extending therefrom. Cylinders 55 are formed in block 51 for containing the tuning coil forms 56 of the receiver. Posts 53 are connected in pairs by two webs 57 and 59. Block 51, posts 53 and webs 57 and 59 may be die-cast as an integral unit. A mounting plate 63 is fixed at one end of the tuner assembly and provides mounting for the worm shaft 22′. A resilient clip 64 engages a recess 62 on shaft 22′ and secures the shaft in position so that shoulder 66 on the shaft abuts plate 63. Holes 65 are formed in plate 63 to allow the ends of tuning slugs 73, which are mounted on the core carriage as will be explained, to clear the plate when the core carriage is close to the plate. Shaft 22′ extends through opening 50 in block 51 and is pivoted at its other end in a mounting panel 52 fixed to the rear side of block 51. Panel 52 also serves to mount forms 56 and may contain solder lugs and connectors for coupling the tuning coils wound on forms 56 to the other parts of the receiver circuitry.

Threads 24′ on shaft 22′ mate with an internally threaded core carriage sleeve 32′ having a flanged portion 49. Sleeve 32′ may be of nylon or some other similar type of resilient material. Sleeve 32′ is part of the core carriage assembly which includes a pair of plates 67 and 69. These plates sandwich flange portion 49 of sleeve 32′ and a tube 71 has a flanged end abutting plate 67 and surrounds a portion of shaft 22′. Portion 49, tube 71 and plates 67 and 69 are fastened together through rivet holes 70. Tuning slugs 73 are fixed to the sleeve portion 49 in holes 74 and are moved by the assembly in cylinders 56 as sleeve 32′ is driven by worm shaft 22′. The core carriage is guided by a guiding slot 75 cooperating with an elongated ridge portion 77. Slot 75 narrows slightly as it passes from the inside of flange portion 49 to the outside, and has a pair of ears 76 extending from the side of minimum width. Two ribs 78 run along each side of ridge portion 77 and their cross sectional dimension is slightly greater than the minimum width of the slot 75. This aids in taking up the manufacturing tolerance and helps in guiding the carriage. The end of tube 71 is necked or crimped down to a close sliding fit over the O.D. of shaft threads 24′. This also helps guide and stabilize the core carriage.

As may be seen in FIG. 8, sleeve 32′ is provided with internal threads of a different lead than the threads 24′ on shaft 22′. As a result, the resiliency of the sleeve 32′ provides a gripping effect on the threads 24′ to effectively eliminate any backlash. The above configuration is easily compacted because of the simplicity in the arrangement of the various elements.

The invention provides, therefore, a manually operable core carriage assembly for a radio receiver tuner mechanism, which effectively eliminates backlash between the driving worm shaft and the driven core carriage. One embodiment of the invention is further adapted to allow for tolerance or bending of the worm shaft without producing binding or wobble of the core carriage. Another embodiment of the invention is of extremely simple construction and can be easily produced in miniature size.

I claim:

1. In a radio receiver tuner mechanism, a core carriage assembly including in combination, a frame member having a plurality of guide rods, a core carriage member slidably mounted upon said rods, a worm shaft rotatably disposed on said frame member, an internally threaded core carriage sleeve mounted within an opening formed in said core carriage member, said sleeve being threadably disposed upon said worm shaft, the threads on said sleeve having a different lead than the threads on said worm shaft to provide an interference fit between such threads, and means fastening said sleeve to said core carriage member permitting movement of said sleeve with respect to said core carriage member transversely of said shaft.

2. In a radio receiver tuner mechanism, a core carriage assembly including in combination, a substantially U-shaped frame member formed with a plurality of openings therethrough, a pair of guide rods fixedly mounted upon said frame member within said openings, a core carriage member having an extending leg slidably mounted upon one of said guide rods and another leg thereof slidably mounted upon another of said guide rods, a threaded worm shaft rotatably mounted within said frame member, an internally threaded sleeve made of resilient material threadably disposed upon said worm shaft, and means adapted to afford a driving connection between said core carriage member and said sleeve, the threads on said resilient sleeve having a different lead than the threads on said worm shaft to provide an interference fit with the threads on said shaft.

3. In a radio receiver tuner mechanism, a core carriage assembly including in combination, a U-shaped frame member having a plurality of openings formed therethrough, a plurality of guide rods fixedly mounted upon said frame, a core carriage member slidably disposed upon said guide rods, an externally threaded worm shaft rotatably disposed on said frame member, means adapted to restrain rotating movement of said worm shaft, an internally threaded sleeve formed of resilient material disposed upon said worm shaft, means including spring washer means adapted to drivingly connect said sleeve and said core carriage member, the threads of said sleeve being formed of a different dimension than the threads formed upon said worm shaft whereby interference fit exists between the threads of said sleeve and the threads of said worm shaft, the threads of said sleeve providing resilient pressure against the threads of said shaft to prevent backlash therebetween, and means fastening said sleeve to said core carriage member permitting movement of said sleeve with respect to said core carriage member transversely of said shaft.

4. In a radio receiver tuner mechanism, a core carriage assembly including in combination, a substantially U-shaped frame member having a plurality of guide rods fixedly mounted thereon, an L-shaped core carriage having one leg slidably mounted upon one of said guide rods and another leg slidably mounted upon another one of said guide rods, an externally threaded worm shaft rotatably disposed on said frame member, an internally threaded plastic sleeve rotatably disposed upon said worm shaft, the threads of said sleeve being of a different lead than the threads on said worm shaft to provide an interference fit between such threads, said core carriage member having an opening for receiving said sleeve with said opening having a larger diameter than the outer diameter of said sleeve, means fastening said sleeve to said core carriage member permitting movement of said sleeve within said opening transversely of said shaft, rotation of said shaft causing movement of said sleeve therealong to move said core carriage member, and means for restricting rotation of said shaft when said core carriage member reaches predetermined positions.

5. In a radio receiver tuner mechanism, a core carriage assembly including in combination, a substantially U-shaped frame formed with a plurality of openings therethrough, first and second guide rods fixedly mounted upon said frame, an L-shaped core carriage member having one leg slidably mounted on said first guide rod and another leg slidably mounted upon said second guide rod, a worm shaft rotatably mounted within two of said openings in said frame, an internally threaded sleeve made of resilient material rotatably mounted upon said worm shaft, said sleeve being formed with a radially extending flange for engaging said core carriage member, washer means secured to said sleeve and adapted to hold said flange in engagement with said core carriage member, the threads of said sleeve being formed of a substantially different dimension than the threads formed upon said worm shaft whereby an interference fit is provided therebetween, the threads of said sleeve providing resilient pressure on the threads of said shaft to reduce backlash upon axial movement of said core carriage member along said worm shaft.

6. In a radio receiver tuner mechanism, the combination including, a frame member, a carriage for controlling tuning elements slidably disposed on said frame member, a threaded worm shaft mounted for rotation on said frame member, an internally threaded sleeve disposed on said worm shaft, said carriage having an opening to receive said sleeve, said sleeve having an outer dimension substantially less than said opening to permit movement of said sleeve within said opening transverse to the axis of said worm shaft, and means securing said sleeve to said carriage and preventing axial and rotary movement of said sleeve with respect to said carriage.

7. An adjustable positioning mechanism including in combination, a frame member having guide means thereon, a carriage member slidably mounted on said frame member, a threaded worm shaft rotatably mounted within said frame member, an internally threaded sleeve made of resilient material threadably disposed upon said worm shaft, and means adapted to afford a driving connection between said carriage member and said sleeve, the threads on said resilient sleeve having a different lead than the threads on said worm shaft to provide an interference fit with the threads on said worm shaft.

8. An adjustable positioning mechanism including in combination, a frame member having guide means thereon, a carriage member slidably mounted in said frame member, a threaded worm shaft rotatably mounted within said frame member, an internally threaded carriage sleeve mounted within an opening formed in said carriage member, said sleeve being threadably disposed upon said worm shaft, and means adapted to afford a driving connection between said carriage member and said sleeve, the threads on said sleeve having a different lead than the threads on said worm shaft to provide an interference fit between such threads.

9. In a radio tuner, a core carriage positioning mechanism including in combination, a frame member having a guiding ridge thereon, a threaded worm shaft rotatably mounted within said frame member, a core carriage assembly slidably mounted in said frame member and having means formed to cooperate with said ridge for guidance, said core carriage assembly including a resilient member, said member being threadably disposed upon said worm shaft, the threads on said member having a different lead than the threads on said worm shaft to provide an interference fit between such threads.

10. In a radio tuner, a core carriage positioning mechanism including in combination, a frame member having four corner posts, at least two of said posts being joined by a web portion, said web portion having an inwardly extending ridge thereon running parallel with said posts, a core carriage assembly having a recessed portion thereon mating with said ridge, said core carriage assembly being linearly slidable and guided by said ridge, said ridge having rib portions thereon forming a cross sectional dimension slightly greater than the width of said recessed portion to provide a tight fit therebetween, a threaded worm shaft rotatably mounted within said frame member, said core carriage assembly including an internally threaded resilient sleeve, said sleeve being threadably disposed upon said worm shaft, the threads on said sleeve having a different lead than the threads on said worm shaft to provide an interference fit between such threads.

11. In a radio tuner, a core carriage positioning mechanism including in combination, a frame member, a core carriage assembly for movement within said frame member and including a resilient member having a slot formed therein, a ridge formed on said frame member and having rib portions thereon forming a cross sectional dimension slightly greater than the minimum width of said slot, said ridge portion and said slot mating with a tight fit therebetween to provide guidance for said core carriage assembly, a threaded worm shaft rotatably mounted within said frame member, said resilient member of said core carriage assembly including an internally threaded resilient sleeve, said sleeve being threadably disposed on said worm shaft, the threads on said sleeve having a different lead than the threads on said worm shaft to provide an interference fit between such threads, and a tube member fixed to said core carriage assembly and surrounding said worm shaft, said tube member having a necked down end so that the inner-diameter of said tube member is only slightly greater than the outer-diameter of the threads on said worm shaft, said tube member thereby providing further stability and guidance for said core carriage assembly.

References Cited by the Examiner

UNITED STATES PATENTS

| | | | |
|---|---|---|---|
| 1,511,049 | 10/24 | Cederquist | 74—424.8 |
| 2,380,774 | 7/45 | Maitland | 74—10.85 X |
| 2,834,216 | 5/58 | Thompson | 74—10.85 |
| 2,984,776 | 5/61 | Barnes | 74—10.85 X |
| 3,083,031 | 3/63 | Elwell | 74—440 X |

BROUGHTON G. DURHAM, *Primary Examiner.*